(12) United States Patent
Taylor et al.

(10) Patent No.: US 7,724,564 B2
(45) Date of Patent: May 25, 2010

(54) CAPACITIVE DIVIDER SENSING OF MEMORY CELLS

(75) Inventors: Jennifer E. Taylor, Boise, ID (US);
John David Porter, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 185 days.

(21) Appl. No.: 12/114,122

(22) Filed: May 2, 2008

(65) Prior Publication Data
US 2009/0273969 A1    Nov. 5, 2009

(51) Int. Cl.
*G11C 11/00*    (2006.01)
(52) U.S. Cl. .................. 365/148; 365/189.09; 365/205
(58) Field of Classification Search .................. 365/148, 365/189.09, 205
See application file for complete search history.

(56) References Cited

U.S. PATENT DOCUMENTS

| | | | |
|---|---|---|---|
| 4,200,863 A | 4/1980 | Hodges et al. | |
| 5,331,599 A | 7/1994 | Emilio | |
| 6,088,278 A | 7/2000 | Porter et al. | |
| 6,275,119 B1 | 8/2001 | Thompson et al. | |
| 6,384,714 B2 | 5/2002 | Thompson et al. | |
| 6,445,259 B1 | 9/2002 | Thompson et al. | |
| 6,469,591 B2 | 10/2002 | Thompson et al. | |
| 6,545,560 B1 | 4/2003 | Thompson et al. | |
| 6,545,561 B2 | 4/2003 | Thompson et al. | |
| 6,556,095 B2 | 4/2003 | Thompson et al. | |
| 6,657,512 B2 | 12/2003 | Thompson et al. | |
| 6,751,150 B2 | 6/2004 | Marr et al. | |
| 6,936,909 B2 | 8/2005 | Marr et al. | |
| 6,958,661 B2 | 10/2005 | Thompson et al. | |
| 7,084,695 B2 | 8/2006 | Porter | |
| 7,101,738 B2 | 9/2006 | Marr et al. | |
| 7,126,871 B2 | 10/2006 | Marr et al. | |
| 7,180,386 B2 | 2/2007 | Thompson et al. | |
| 7,310,013 B2 | 12/2007 | Porter | |
| 2001/0033514 A1* | 10/2001 | Takata et al. ............ | 365/189.07 |
| 2002/0075968 A1 | 6/2002 | Zerbe et al. | |
| 2006/0050545 A1* | 3/2006 | Rohr ............................ | 365/148 |
| 2006/0231922 A1 | 10/2006 | Marr et al. | |
| 2006/0250853 A1 | 11/2006 | Taylor et al. | |
| 2007/0121368 A1* | 5/2007 | Gilbert ........................ | 365/148 |
| 2008/0002481 A1 | 1/2008 | Gogl et al. | |

OTHER PUBLICATIONS

International Search Report and Written Opinion for related PCT Application PCT/US2009/002346, dated Dec. 14, 2009 (14 pgs.).

* cited by examiner

*Primary Examiner*—Hoai V Ho
(74) *Attorney, Agent, or Firm*—Brooks, Cameron & Huebsch, PLLC (57) ABSTRACT

The present disclosure includes devices and methods for sensing resistance variable memory cells. One device embodiment includes at least one resistance variable memory cell, and a capacitive divider configured to generate multiple reference levels in association with the at least one resistance variable memory cell.

29 Claims, 9 Drawing Sheets

| | LAYOUT AREA 772 | DC CURRENT CONSUMPTION 773 | AVERAGE CURRENT CONSUMPTION OVER A 50 NANOSECOND SENSING OPERATION 774 | POWER-UP TIME 775 |
|---|---|---|---|---|
| RESISTIVE VOLTAGE DIVIDER 770 | $1.2 \times 10^6$ square microns | 6.4 microamps | 6.4 microamps | 2.8 microseconds |
| CAPACITIVE DIVIDER 771 | $1.2 \times 10^5$ square microns | 0 | 6.4 microamps | 12 nanoseconds |

CAPACITIVE DIVIDER SENSING OF MEMORY CELLS

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), flash memory, and resistance variable memory, among others.

Memory can be volatile or non-volatile. Volatile memory requires power to maintain the information stored therein, e.g., when power to volatile memory is lost, the information stored therein is also lost. Non-volatile memory, in contrast, does not lose the information stored therein in the absence of power, e.g., non-volatile memory can retain the information stored therein even if no power is being provided to the memory. Types of volatile memory include RAM, DRAM, and SDRAM, among others. Types of non-volatile memory include ROM, flash memory, and resistance variable memory, among others.

Types of resistance variable memory include programmable conductor memory, phase change random access memory (PCRAM), and resistive random access memory (RRAM), among others. A physical layout of a PCRAM memory device can resemble that of a DRAM device, with the capacitor of the DRAM cell being replaced by a phase change material, such as Germanium-Antimony-Telluride (GST). A physical layout of an RRAM memory device may include memory cells including a variable resistor thin film, e.g., a colossal magnetoresistive material, which can be connected to an access device, such as a diode, a field effect transistor (FET), or a bipolar junction transistor (BJT), for example.

The memory cell material of a PCRAM device, e.g., GST, can exist in an amorphous, high resistance state, or a crystalline, low resistance state. The resistance state of the PCRAM cell can be altered by applying current pulses to the cell. For example, the resistance state of the PCRAM cell can be altered by heating the cell with a programming current. This results in the PCRAM cell being programmed to a particular resistance state. In a binary system, for example, the amorphous, high resistance state can correspond to a logic state of 1, and the crystalline, low resistance state can correspond to a logic state of 0. However, the choice of these corresponding logic states is arbitrary, that is, in other binary systems, the amorphous, high resistance state can correspond to a logic state of 0, and the crystalline, low resistance state can correspond to a logic state of 1. The resistance state of an RRAM cell, e.g., the variable resistor thin film, can be increased and/or decreased by applying positive and/or negative electrical pulses across the film. This can result in the RRAM cell being programmed to a particular resistance state.

A single level memory cell (SLC) can represent two programmed states as represented by the binary digits 1 or 0. Memory cells can also be programmed to more than two states, such as to a number of states that allows a cell to represent more than two binary digits, e.g., 1111, 0111, 0011, 1011, 1001, 0001, 0101, 1101, 1100, 0100, 0000, 1000, 1010, 0010, 0110, and 1110. Such cells may be referred to as multi state memory cells, multibit cells, or multilevel cells (MLCs). MLCs can allow the manufacture of higher density memories without increasing the number of memory cells since each cell can represent more than one digit, e.g., more than one bit.

The programmed resistance state of a resistance variable memory cell corresponds to the data state of the cell and can be determined by sensing a voltage and/or current associated with the cell. During a sensing operation, e.g., a data read operation, a sensed voltage and/or current associated with the memory cell can be compared with one or more reference voltages and/or currents in order to determine the particular data state of the cell.

DETAILED DESCRIPTION

Methods, devices, and systems for sensing resistance variable memory, such as programmable conductor memory, resistance random access memory (RRAM), and/or phase change random access memory (PCRAM), among others, are described herein. One or more embodiments include a capacitive divider as part of a sensing scheme having low average power consumption and/or fast power-up time.

One or more embodiments can include at least one resistance variable memory cell, and a capacitive divider configured to generate multiple reference levels in association with the at least one resistance variable memory cell. One or more embodiments can include generating multiple reference levels by charging a capacitive divider, and comparing at least one of the multiple reference levels with an output of the resistance variable memory cell.

In the following detailed description of the present disclosure, reference is made to the accompanying drawings that form a part hereof, and in which is shown by way of illustration how one or more embodiments of the disclosure may be practiced. These one or more embodiments are described in sufficient detail to enable those of ordinary skill in the art to practice the one or more embodiments of this disclosure, and it is to be understood that other embodiments may be utilized and that process, electrical, or mechanical changes my be made without departing from the scope of the present disclosure.

Figure 1:
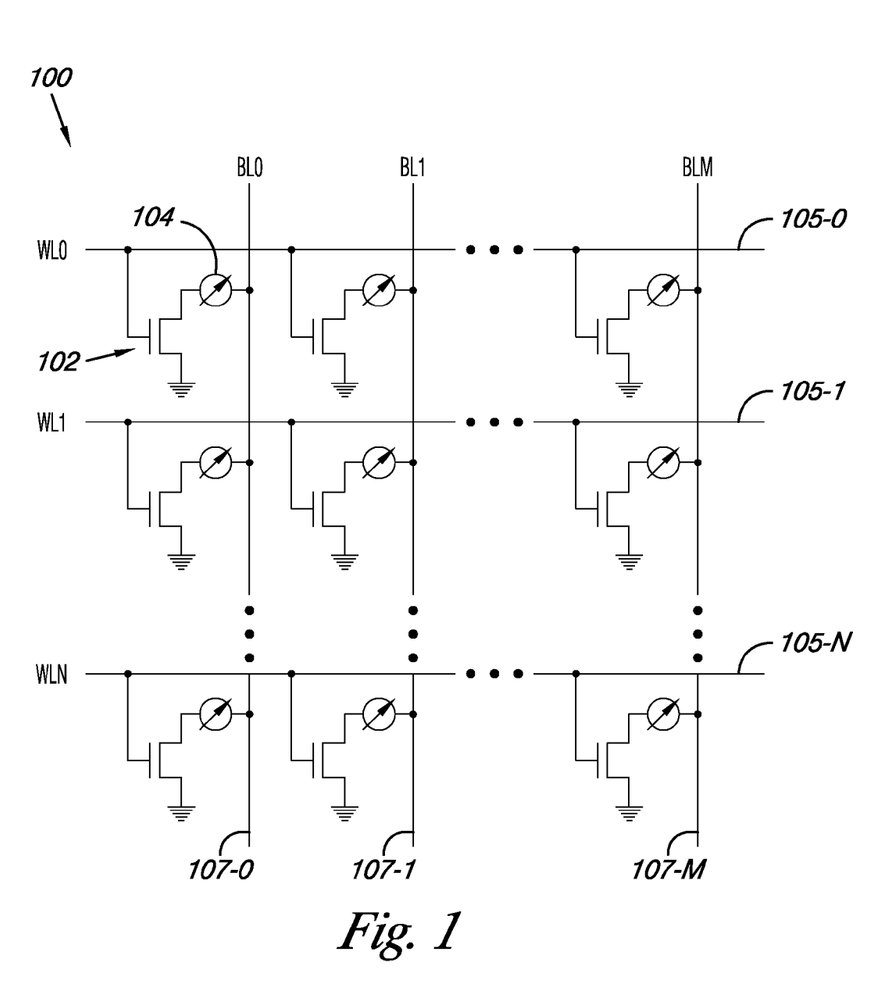
FIG. 1 is a schematic of a portion of a phase change memory array that can be used with one or more embodiments of the present disclosure.

FIG. 1 is a schematic of a portion of a phase change memory array 100 that can be used with one or more embodiments of the present disclosure. In the embodiment illustrated in FIG. 1, the memory array 100 includes a number of phase change memory cells each having an associated access device 102 and resistance variable element 104, e.g., a phase change material 104. The access devices 102 can be operated, e.g., turned on/off, to access the memory cells in order to perform operations such as data programming and/or data reading operations on the resistance variable elements 104.

In the embodiment illustrated in FIG. 1, the access devices 102 are metal oxide semiconductor field effect transistors (MOSFETs). As shown in FIG. 1, a gate of each MOSFET 102 associated with each memory cell is coupled to one of a number of select lines 105-0 (WL0), 105-l (WL1), ..., 105-N (WLN), i.e., each select line 105-0, 105-1, ..., 105-N is coupled to a row of phase change memory cells. The select lines 105-0, 105-1, ..., 105-N may be referred to herein as "word lines." The designator "N" is used to indicate that a memory array can include a number of select lines. The use of the term "row" is not meant to imply a particular linear and/or horizontal orientation of the memory cells. Rather, a row can mean a number of memory cells coupled to a particular select line, regardless of the orientation of the memory cells. For example, a row can include a number of memory cells coupled to a particular select line in a staggered, non-linear orientation.

In one or more embodiments, the resistance variable elements 104 can be a phase change chalcogenide alloy such as a Germanium-Antimony-Tellurium (GST) material, e.g., a Ge—Sb—Te material such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other phase change materials can include GeTe, In—Se, $Sb_2Te_3$, GaSb, InSb, As—Te, Al—Te, SbSe, Ge—Sb—Te, Ge—Sb—Se, Te—Ge—As, In—Sb—Te, Te—Sn—Se, Ge—Se—Ga, Bi—Se—Sb, Ga—Se—Te, Sn—Sb—Te, In—Sb—Ge, In—Sb—Se, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, and Ag—In—S—Se—Te among various other phase change materials. However, embodiments of the present disclosure are not so limited, and can include impurities and/or the addition of other elements as well.

In the embodiment illustrated in FIG. 1, each resistance variable element 104 is coupled to one of a number of sense lines 107-0 (BL0), 107-1 (BL1), ..., 107-M (BLM), i.e., each sense line 107-0, 107-1, ..., 107-M is coupled to a column of phase change memory cells. The sense lines 107-0, 107-1, ..., 107-M may be referred to herein as "bit lines." The designator "M" is used to indicate that a memory array can include a number of sense lines. For ease of addressing in the digital environment, the number of select lines 105-1, ..., 105-N and the number of sense lines 107-1, ..., 107-M can each be some power of two, e.g., 256 select lines by 4,096 sense lines. However, embodiments are not limited to particular numbers of select lines and/or sense lines. Further, the use of the term "column" is not meant to imply a particular linear and/or vertical orientation of the memory cells. Rather, a column can mean a number of memory cells coupled to a particular sense line, regardless of the orientation of the memory cells. For example, a column can include a number of memory cells coupled to a particular sense line in a staggered, e.g., non-linear, fashion.

In operation, appropriate voltage and/or current signals, e.g., pulses, can be applied to the sense lines 107-0, 107-1, ..., 107-M and select lines 105-0, 105-1, ..., 105-N in order to program data to and/or read data from the phase change memory cells of the array 100. As an example, the data stored by a phase change memory cell of array 100 can be determined by turning on an access device, e.g., 102, and sensing a current passing through the phase change element, e.g., 104. The current sensed on the bit line associated with the memory cell being read, e.g., bit line 107-0, 107-1, ..., 107-M, corresponds to a resistance state of the phase change element 104, which in turn corresponds to a particular data value, e.g., a binary value such as 1, 0, 001, 111, 1011, etc.

Embodiments of the present disclosure are not limited to the example array 100 illustrated in FIG. 1. For example, as one of ordinary skill in the art will appreciate, the access device 102 associated with a particular memory cell can be device other than a MOSFET. In some embodiments, the access device 102 can be a diode or a bipolar junction transistor (BJT), among other types of access devices. Also, a memory array can have an architecture other than that illustrated in FIG. 1, as will be understood by one of ordinary skill in the art.

As one of ordinary skill in the art will appreciate, the phase change memory array 100 can be coupled to programming circuitry and/or sensing circuitry (not shown in FIG. 1). Examples of sensing circuitry and methods in accordance with embodiments of the present disclosure are described further below in connection with FIGS. 3-6 and 8-9.

The number of phase change memory cells shown in memory array 100 can be single level cells (SLCs) and/or multilevel cells (MLCs). A single level phase change memory cell can be programmed to a generally more amorphous (reset) state or a generally more crystalline (set) state. Such reset and/or set states may correspond to a binary 0 and/or 1. A reset pulse can include a relatively high current pulse applied to the cell for a relatively short period of time. The current applied to the cell can be quickly reduced after the phase change material "melts," allowing the cell to cool quickly into a more amorphous state where atomic motion that can allow crystallization generally occurs to a lesser degree due, at least in part, to relatively rapid cooling of the material. Conversely, a set pulse can include a relatively lower current pulse applied to the cell for a relatively longer period of time with a slower quenching speed, e.g., the current may be more slowly reduced allowing the phase change material greater time to cool. Accordingly, the material may crystallize to a greater degree than after the reset pulse. Some phase change materials can have a greater resistivity associated with a more amorphous state and a lesser resistivity associated with a more crystalline state.

Multilevel phase change memory cells can be programmed to one or more intermediate states between amorphous and crystalline. That is, multilevel phase change memory cells can be programmed to various degrees of structural order. Through application of one or more programming pulses at particular current levels, the cells can be programmed to a given resistance state. With appropriate programming currents, the cells can be programmed to one or more intermediate states having a partial amorphous and a partial crystalline structure, providing for multilevel resistance states. The number of programming states chosen for a particular cell can be based on, for example, the desired application, design and process limits, e.g., programming time, sensing time, and accuracy of sensing circuitry, and other factors. Multilevel phase change memory cells are further described in connection with FIG. 2.

Figure 2:
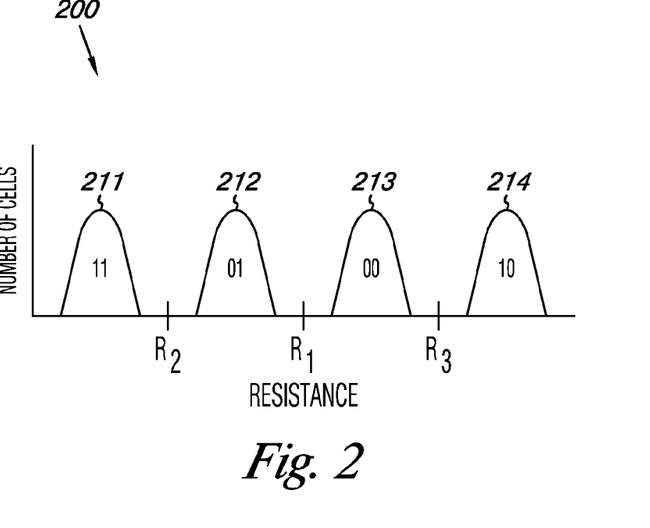
FIG. 2 is a graph illustrating various programming states for a number of multilevel phase change memory cells that can be sensed in accordance with one or more embodiments of the present disclosure.

FIG. 2 is a graph 200 illustrating various programming states for a number of multilevel phase change memory cells that can be sensed in accordance with one or more embodiments of the present disclosure.

Graph 200 illustrates four resistance distributions, e.g., 211, 212, 213, and 214, that can be used with two bit phase change memory cells. Each resistance distribution includes a number of memory cells, and each memory cell in a particular resistance distribution is programmed a resistance state within the particular resistance distribution. As shown in FIG. 2, each resistance distribution represents memory cells programmed to a particular data state, e.g., 11, 01, 00, and 10. That is, resistance distribution 211 represents those memory cells programmed to a data state of 11, resistance distribution 212 represents those memory cells programmed to a data state of 01, resistance distribution 213 represents those memory cells programmed to a data state of 00, and resistance distribution 214 represents those memory cells programmed to a data state of 10. However, as will be appreciated by one of skill in the art, each resistance distribution can be chosen to represent those memory cells programmed to any particular data state. For example, resistance distribution 211 could represent those memory cells programmed to a data state of 10, resistance distribution 212 could represent those memory cells programmed to a data state of 00, resistance distribution 213 could represent those memory cells programmed to a data state of 01, and resistance distribution 214 could represent those memory cells programmed to a data state of 11.

Each data state, e.g., 11, 01, 00, and 10, can represent a different programming state. For example, data state 11 can represent a first programming state, data state 01 can represent a second programming state, data state 00 can represent a third programming state, and data state 10 can represent a fourth programming state.

The data state of a phase change memory cell can be determined by sensing a voltage and/or current associated with the cell. During a sensing operation, e.g., a data read operation, a sensed voltage and/or current associated with the cell can be compared with one or more reference voltages and/or currents in order to determine the data state of the cell.

A sensing operation, e.g., data read operation, of a multilevel phase change memory cell can include a comparison of a voltage and/or current associated with the cell with multiple reference voltages and/or currents. For example, a voltage and/or current associated with the cell can be the voltage and/or current output from the cell when the cell is selected, e.g., when the cell is "turned on." A cell may be selected, e.g., "turned on" by biasing a select line corresponding to the selected cell at a first particular voltage, e.g., 1.8V, and a sense line corresponding to the selected cell at a second particular voltage, e.g., 0.3V, in order to allow current to flow across the phase change material of the cell. The voltage and/or current output from the selected cell, at least partially in response to the biasing voltages, can depend on the resistance state to which the cell has been programmed. For example, a selected cell that has been programmed to a higher resistance state can have a higher voltage and/or lower current output, while a selected cell that has been programmed to a lower resistance state can have a lower voltage and/or higher current output. Accordingly, the voltage and/or current associated with the programmed resistance state of the selected cell, e.g., the output of the selected cell, can be compared to generated reference levels, e.g., reference voltages and/or currents, in order to determine the data state of the cell.

For example, a sensing operation of a two bit phase change memory cell can include a comparison of a voltage and/or current associated with the two bit cell with two reference voltages and/or currents. In such a sensing operation, a voltage and/or current output of the two bit cell can first be compared with a first reference voltage and/or current associated with a first resistance state, e.g., resistance state $R_1$ shown in FIG. 2. The voltage and/or current output of the two bit cell can then be compared with a second reference voltage and/or current associated with a second resistance state, e.g., resistance state $R_2$ or $R_3$ shown in FIG. 2, in order to determine the data state of the cell. The reference voltage and/or current used in the second comparison can be dictated by the result of the first comparison. For example, if the first comparison indicates that the voltage and/or current output of the two bit cell is lower than the first reference voltage and/or current, the voltage and/or current associated with $R_2$ can be used as the reference voltage and/or current in the second comparison, but if the first comparison indicates that the voltage and/or current output of the two bit cell is greater than the first reference voltage and/or current, the voltage and/or current associated with $R_3$ can be used as the second reference voltage and/or current in the second comparison.

Embodiments of the present disclosure are not limited to the sensing operation of the previously discussed example, and are not limited to the two bit phase change memory cells described in connection with FIG. 2. Rather, embodiments of the present disclosure can include other sensing operations, and can include sensing multilevel phase change memory cells having other numbers of programmed states.

Figure 3:
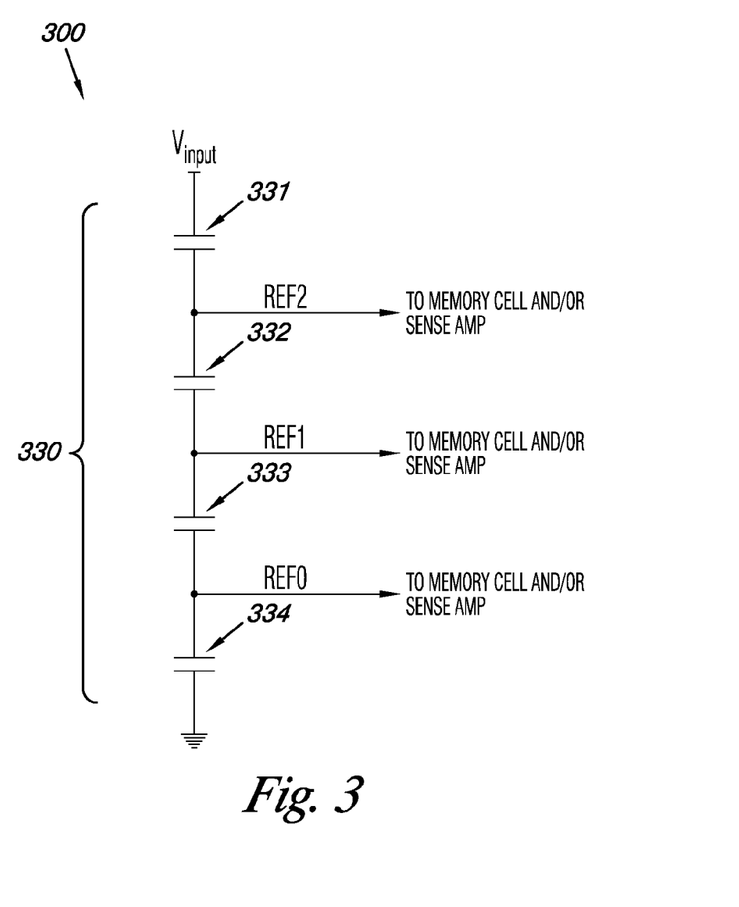
FIG. 3 is a schematic illustrating a portion of sensing circuitry in accordance with one or more embodiments of the present disclosure.

FIG. 3 is a schematic illustrating a portion of sensing circuitry 300 in accordance with one or more embodiments of the present disclosure. Sensing circuitry 300 can be used in resistance variable memory cell sensing operations, e.g., operations that determine the data state of a resistance variable memory cell.

In the embodiment illustrated in FIG. 3, sensing circuitry 300 includes a capacitive divider 330. In the embodiment illustrated in FIG. 3, the capacitive divider 330 includes a number of capacitors, e.g., 331, 332, 333, and 334, coupled in series. In the embodiment illustrated in FIG. 3, the capacitors 331, 332, 333, and 334 have particular fixed capacitances. In various embodiments, capacitors 331, 332, 333, and 334 can be adjustable capacitors, as described further below in connection with FIGS. 4, 5, and 6. Embodiments of the present disclosure are not limited to the example illustrated in FIG. 3, and can include other capacitive dividers.

As shown in the embodiment illustrated in FIG. 3, a number of reference levels, e.g., REF0, REF1, and REF2, can be generated by applying a single input voltage, e.g., $V_{input}$, to the capacitive divider 330. In one or more embodiments, the number of reference levels can be voltage levels. However, embodiments of the present disclosure are not so limited, and can include other types of reference levels. The number of reference levels that are to be generated can be determined by the characteristics of the memory cell to be sensed. For example, in the embodiment illustrated in FIG. 3, three reference levels, e.g., REF0, REF1, and REF2, are generated for distinguishing between four data states, e.g., for use in sensing a two bit memory cell. However, embodiments of the present disclosure are not so limited, and can include generating other numbers of reference levels for use in sensing memory cells representing more or fewer than two bits, e.g., three bit memory cells, four bit memory cells, etc.

The reference levels, e.g., REF0, REF1, and REF2, can be generated simultaneously upon the application of the single input voltage, e.g., $V_{input}$, to the capacitive divider 330. However, embodiments of the present disclosure and not so limited, and may include embodiments in which a number of reference levels are generated sequentially. Examples of embodiments in which a number of reference levels are generated sequentially are described further below in connection with FIGS. 4, 5, and 6.

In one or more embodiments, the capacitances of the capacitors, e.g., 331, 332, 3 33, and 334, in the capacitive divider 330 can vary with temperature. For instance, a change in temperature can cause a change in the capacitances of the capacitors in the capacitive divider 330. In such embodiments, the capacitances of the capacitors can track with temperature, e.g., a change in temperature can cause the same or similar capacitance change in each capacitor. Because the capacitances of the capacitors can track with temperature, a change in temperature may not appreciably affect the reference levels, e.g., REF0, REF1, and REF2, generated by the capacitive divider. That is, in various embodiments, the reference levels generated by the capacitive divider do not vary with temperature, e.g., the reference levels generated by the capacitive divider can be temperature independent.

In one or more embodiments, the single input voltage, e.g., $V_{input}$, applied to the capacitive divider can be supplied by a bandgap circuit (not shown in FIG. 3). The bandgap circuit can be, for example, a standard CMOS bandgap circuit, as will be understood by one of ordinary skill in the art. Using a bandgap circuit to supply the single input voltage can ensure that the single input voltage is temperature invariant and/or power supply invariant, such that a change in temperature and/or variation in power supply does not cause a change in the single input voltage. However, embodiments of the present disclosure are not limited to a particular type of circuit for providing the single input voltage.

The number of reference levels, e.g., REF0, REF1, and REF2, generated by the capacitive divider can be used in both single level and multilevel resistance variable memory cell sensing operations, e.g., data read operations. Such sensing operations can include comparing one or more of the number of generated reference levels with a voltage and/or current associated with the programmed resistance state, e.g., an output voltage and/or current, of the resistance variable memory cell in order to determine the data state of the cell.

For example, in the embodiment illustrated in FIG. 3, three reference levels, e.g., REF0, REF1, and REF2, can be generated for use in sensing a two bit resistance variable memory cell. A first reference level, e.g., REF1, can be compared with the output voltage and/or current of the memory cell in order to determine whether the output voltage and/or current is greater or less than the first reference level. This first comparison can indicate the first digit of binary data, e.g., 0 or 1, associated with the memory cell. A second reference level, e.g., REF0 or REF2, can then be compared with the output voltage and/or current of the memory cell in order to determine whether the output voltage and/or current is greater or less than the second reference level. This second comparison can indicate the second digit of binary data, e.g., 0 or 1, associated with the memory cell. The reference level, e.g., REF0 or REF2, that is used as the second reference level in the second comparison can depend on the result of the first comparison. For example, if the first comparison determines that the first digit of binary data is 0, REF0 can be used as the second reference level, and if the first comparison determines that the first digit of binary data is 1, REF2 can be used as the second reference level. However, embodiments of the present disclosure are not so limited, and may include other types of sensing operations. For example, reference voltage and/or currents can be generated sequentially, as described further below in connection with FIGS. 4, 5, and 6.

The number of reference levels, e.g., REF0, REF1, and REF2, can be coupled to one or more resistance variable memory cells (not shown), e.g., the phase change memory cells shown in FIG. 1. The number of reference levels can also be coupled to sensing circuitry, e.g., one or more sense amps, (not shown), as further described below in connection with FIGS. 8 and 9. The sensing circuitry can be coupled to one or more resistance variable memory cells, e.g. the phase change memory cells shown in FIG. 1, and can be used in sensing operations in accordance with one or more embodiments of the present disclosure.

The number of reference levels, e.g., REF0, REF1, and REF2, may not be used at all times. For example, the reference levels may not be used when a sensing operation is complete and/or during a stand-by operation. When the number of reference levels are not being used, they can be pulled to ground, which can reduce the amount of power consumed by the capacitive divider. In one or more embodiments, the capacitive divider can achieve zero power consumption while the number of reference levels are not being used by pulling the number of reference levels to ground.

Figure 4:
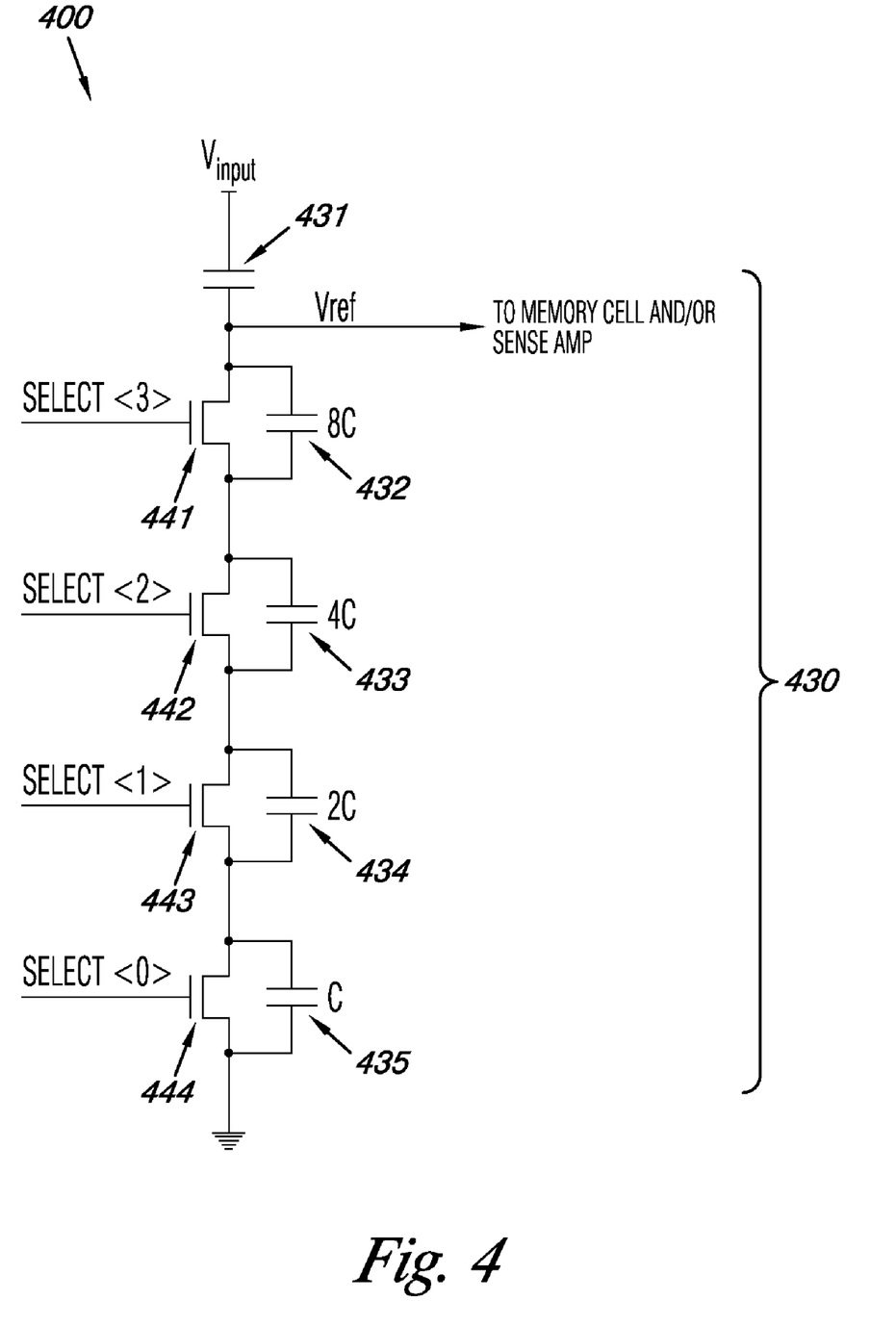
FIG. 4 is a schematic illustrating a portion of sensing circuitry in accordance with one or more embodiments of the present disclosure.

FIG. 4 is a schematic illustrating a portion of sensing circuitry 400 in accordance with one or more embodiments of the present disclosure. Sensing circuitry 400 can be used in resistance variable memory cell sensing operations, e.g., operations that determine the data state of a resistance variable memory cell.

In the embodiment illustrated in FIG. 4, the sensing circuitry 400 can include a capacitive divider 430. In the embodiment illustrated in FIG. 4, the capacitive divider 430 includes a number of capacitors, e.g., 431, 432, 433, 434, and 435, coupled in series. In the embodiment illustrated in FIG. 4, the capacitors 432, 433, 434, and 435 are arranged in a binary-weighted configuration. As used herein, a binary-weighted configuration means a capacitor configuration in which the capacitances of a number of the capacitors increase and/or decrease sequentially by powers of two. For example, in the embodiment illustrated in FIG. 4, capacitor 432 has a capacitance of 8 C, capacitor 433 has a capacitance of 4 C, capacitor 434 has a capacitance of 2 C, and capacitor 435 has a capacitance of C, where C is some capacitance value. However, embodiments of the present disclosure are not so limited, and can include capacitive dividers having other configurations.

In the embodiment illustrated in FIG. 4, capacitors 432, 433, 434, and 435 are adjustable capacitors. As used herein, an adjustable capacitor means a capacitor whose capacitance is not fixed, that is, a capacitor whose capacitance is adjustable. Additionally, in the embodiment illustrated in FIG. 4, capacitive divider 430 is an adjustable capacitive divider. As used herein, an adjustable capacitive divider is a capacitive divider whose net, e.g., equivalent, capacitance is not fixed, that is, a capacitive divider whose net, e.g., equivalent, capacitance is adjustable. Embodiments of the present disclosure are not limited to the example illustrated in FIG. 4, and can include other capacitive dividers.

In one or more embodiments, the capacitances of the adjustable capacitors, e.g., 432, 433, 434, and 435, can be adjusted, e.g., controlled and/or trimmed, by logic. Additionally, in one or more embodiments, the net, e.g., equivalent, capacitance of the adjustable capacitive divider, e.g., 430, can be adjusted, e.g., controlled and/or trimmed, by logic. For example, in the embodiment illustrated in FIG. 4, SELECT signals, e.g., SELECT<3>, SELECT<2>, SELECT<1>, and SELECT<0>, are used to select and/or bypass adjustable capacitors 432, 433, 434, and 435, thereby adjusting, e.g., controlling and/or trimming, the net, e.g., equivalent, capacitance of the adjustable capacitive divider 430. In one or more embodiments, the signal bits of the SELECT signals can be set by fuses and/or varied during memory cell operations. In the embodiment illustrated in FIG. 4, the SELECT signals are coupled to transistors, e.g., MOSFETs 441, 442, 443, and 444, and are used to control the output of the transistors, as will be understood by one of ordinary skill in the art. In the embodiment illustrated in FIG. 4, the output of the transistors is coupled to the adjustable capacitive divider 430, and can be used to adjust the net, e.g., equivalent, capacitance of the adjustable capacitive divider 430. However, embodiments of the present disclosure are not so limited, and can include other devices and/or methods for logically adjusting the capacitances of the adjustable capacitors and/or the net, e.g., equivalent, capacitance of the adjustable capacitive divider.

As shown in the embodiment illustrated in FIG. 4, a reference level, e.g., $V_{ref}$, can be generated by applying a single input voltage, e.g., $V_{input}$, to capacitive divider 430. In one or more embodiments, the reference level can be a voltage level. However, embodiments of the present disclosure are not so limited, and can include other types of reference levels. In the one or more embodiments in which the capacitive divider includes adjustable capacitors and/or is an adjustable capacitive divider, the reference level, e.g., $V_{ref}$, can be varied by adjusting, e.g., controlling and/or trimming, the capacitances of one or more of the adjustable capacitors and/or the net, e.g., equivalent, capacitance of the adjustable capacitive divider. That is, a change in the capacitance of one or more of the adjustable capacitors and/or a change in the net, e.g., equivalent, capacitance of the adjustable capacitive divider can cause a change in the reference level. In one or more embodiments, a number of different reference levels can be sequentially generated by sequentially adjusting, e.g., controlling and/or trimming, the capacitances of the adjustable capacitors and/or the net, e.g., equivalent, capacitance of the adjustable capacitive divider. The number of different reference levels to be generated can be determined by the characteristics of the memory cell to be sensed. For example, three reference levels can be generated for distinguishing between four data states, e.g., for use in sensing a two bit memory cell. However, embodiments of the present disclosure are not so limited, and can include generating other numbers of different reference levels for use in sensing memory cells representing more or fewer than two bits, e.g., three bit memory cells, four bit memory cells, etc.

In one or more embodiments, the accuracy, e.g., resolution, of the number of different reference levels can be proportional to the number of SELECT signal bits used during a sensing operation. For example, the resolution can be given by:

Resolution=$1/(2^N)$ where N is the number of SELECT signal bits used during the sensing operation.

In one or more embodiments, the number of different reference levels generated by the capacitive divider can be temperature independent, as previously described in connection with FIG. 3. Further, in one or more embodiments, the number of different reference levels can be pulled to ground when they are not needed and/or not being used, as previously described in connection with FIG. 3. Also, in one or more embodiments, the single input voltage, e.g., $V_{input}$, can be supplied by a bandgap circuit (not shown in FIG. 4), and can be temperature and/or power supply invariant, as previously described in connection with FIG. 3.

The reference level, e.g., $V_{ref}$, generated by the capacitive divider can be used in both single level and multilevel resistance variable memory cell sensing operations, e.g., data read operations. Single level cell sensing operations can include comparing the generated reference level with a voltage and/or current associated with the programmed resistance state, e.g., an output voltage and/or current, of the resistance variable memory cell in order to determine the data state of the cell. Multilevel cell sensing operations can include comparing a number of different reference levels generated by the capacitive divider with a voltage and/or current associated with the programmed resistance state, e.g., an output voltage and/or current, of the resistance variable memory cell in order to determine the data state of the cell. In such multilevel cell sensing operations, a first generated reference level can be compared with the output voltage and/or current of the memory cell, and the adjustable capacitors and/or net, e.g., equivalent, capacitance of the capacitive divider can be logically adjusted, e.g., controlled and/or trimmed, in response to this comparison. The capacitive divider can then generate a second reference level, which can be compared with the output voltage and/or current of the memory cell. This process can be repeated as necessary until the data state of the memory cell is sensed.

For example, two different reference levels can be generated for use in sensing a two bit resistance variable memory cell. A first reference level can be generated and compared with the output voltage and/or current of the memory cell in order to determine whether the output voltage and/or current is greater or less than the first reference level. This first comparison can indicate the first digit of binary data, e.g., 0 or 1, associated with the memory cell. Based on the results of this first comparison, e.g., based on whether the first digit of binary data is 0 or 1, the adjustable capacitors and/or net, e.g., equivalent, capacitance of the capacitive divider can be logically adjusted, e.g., controlled and/or trimmed, to different capacitances such that a second reference level can be generated by the capacitive divider. This second reference level can then be compared with the output voltage and/or current of the memory cell in order to determine whether the output voltage and/or current is greater or less than the first reference level. This second comparison can indicate the second digit of binary data, e.g., 0 or 1, associated with the memory cell. However, embodiments of the present disclosure are not so limited, and can include other types of sensing operations, for example, sensing operations in which the second digit of binary data associated with the memory cell is determined from the first comparison and the first digit is determined from the second comparison.

In one or more embodiments, the capacitances to which the adjustable capacitors are to be adjusted and/or the net, e.g., equivalent, capacitance to which the adjustable capacitive divider is to be adjusted can be determined by a state machine, as will be understood by one of ordinary skill in the art. A state machine can also be used to control the transistors 441, 442, 443, and 444 of the capacitive divider 430, as will be understood by one of ordinary skill in the art. However, embodiments of the present disclosure are not so limited, and can include other devices and/or methods for determining the capacitances to which the adjustable capacitors are to be adjusted and/or the net, e.g., equivalent, capacitance to which the adjustable capacitive divider is to be adjusted, and can include other devices and/or methods for controlling the transistors.

The reference level, e.g., $V_{ref}$, can be coupled to one or more resistance variable memory cells (not shown), as previously described in connection with FIG. 3. The number of reference levels can also be coupled to sensing circuitry, e.g., one or more sense amps, (not shown), as previously described in connection with FIG. 3, and as further described in connection with FIGS. 8 and 9.

Figure 5:
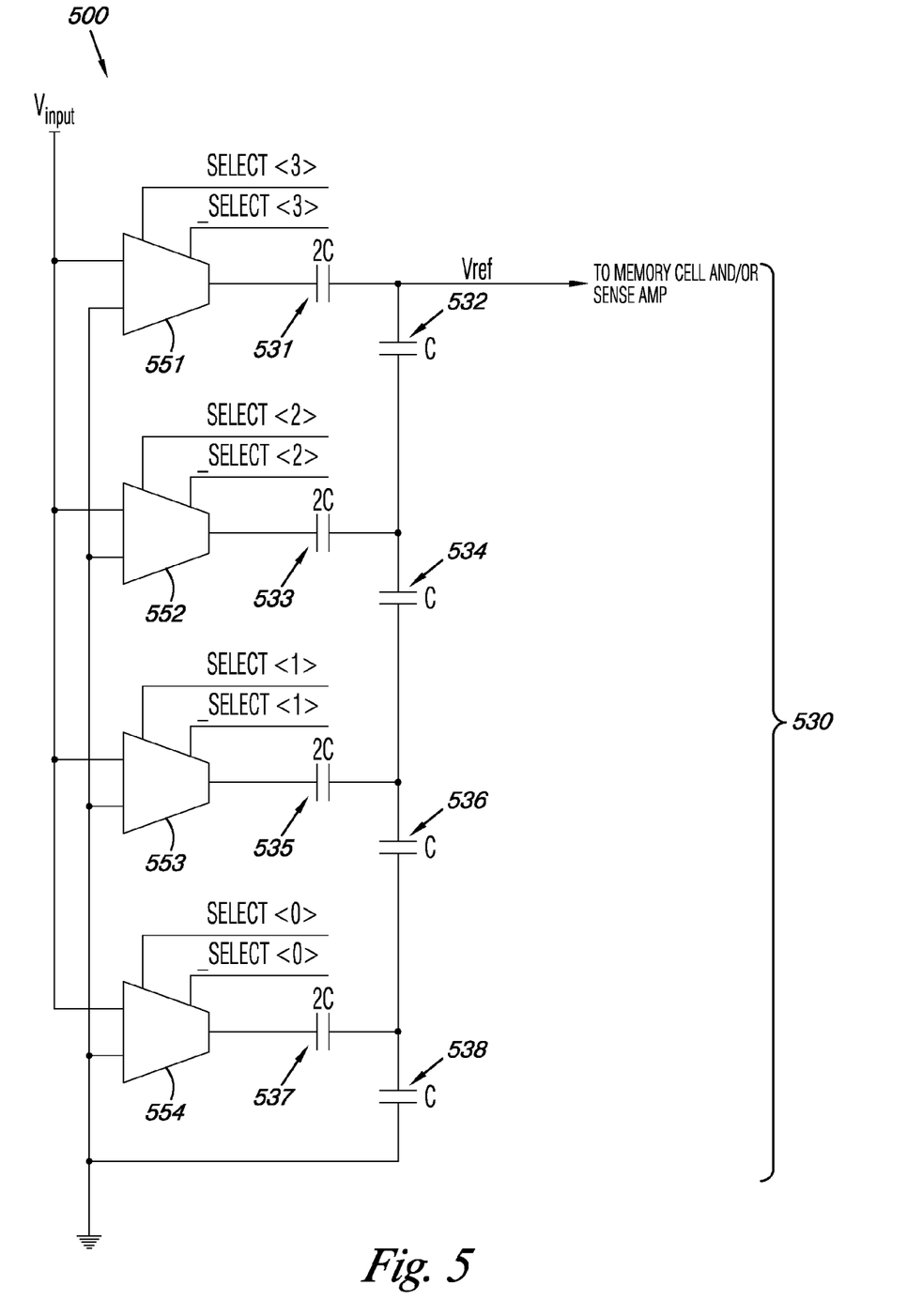
FIG. 5 is a schematic illustrating a portion of sensing circuitry in accordance with one or more embodiments of the present disclosure.

FIG. 5 is a schematic illustrating a portion of sensing circuitry 500 in accordance with one or more embodiments of the present disclosure. Sensing circuitry 500 can be used in resistance variable memory cell sensing operations, e.g., operations that determine the data state of a resistance variable memory cell.

In the embodiment illustrated in FIG. 5, the sensing circuitry 500 includes a capacitive divider 530. In the embodiment illustrated in FIG. 5, the capacitive divider 530 includes a number of capacitors, e.g., 531, 532, 533, 534, 535, 536, 537, and 538, coupled in a C-2 C configuration. As used herein, a C-2 C configuration means a capacitor configuration in which the capacitances of a number of the capacitors alternate between C and 2 C or 2 C and C, where C is some capacitance value. For example, in the embodiment illustrated in FIG. 5, capacitors 531, 533, 535, and 537 each have a capacitance of 2 C, and capacitors 532, 534, 536, and 538 each have a capacitance of C, where C is some capacitance value. However, embodiments of the present disclosure are not so limited, and can include capacitive dividers having other C-2 C configurations.

In the embodiment illustrated in FIG. 5, each capacitor is an adjustable capacitor. Additionally, in the embodiment illustrated in FIG. 5, capacitive divider 530 is an adjustable capacitive divider. As previously described in connection with FIG. 4, an adjustable capacitor means a capacitor whose capacitance is not fixed, that is, a capacitor whose capacitance is adjustable, and an adjustable capacitive divider means a capacitive divider whose net, e.g., equivalent, capacitance is not fixed, that is, a capacitive divider whose net, e.g., equivalent, capacitance is adjustable. Embodiments of the present disclosure are not limited to the example illustrated in FIG. 5, and can include other capacitive dividers.

In one or more embodiments, the capacitances of the adjustable capacitors can be adjusted, e.g., controlled, and/or trimmed, by logic. Additionally, in one or more embodiments, the net, e.g., equivalent, capacitance of the adjustable capacitive divider, e.g., 530, can be adjusted, e.g., controlled and/or trimmed, by logic. For example, in the embodiment illustrated in FIG. 5, SELECT signals, e.g., SELECT<3>, SELECT<2>, SELECT<1>, and SELECT<0>, and _SELECT signals, e.g., _SELECT<3>, _SELECT<2>, _SELECT<1>, and _SELECT<0>, are used to select and/or bypass the adjustable capacitors, thereby adjusting, e.g., controlling and/or trimming, the net, e.g., equivalent, capacitance of the adjustable capacitive divider 530. In one or more embodiments, the signal bits of the SELECT signals can be set by fuses and/or varied during memory cell operations. In the embodiment illustrated in FIG. 5, the SELECT signals are coupled to switches, e.g., 551, 552, 553, and 554, and are used to control the output of the switch, as will be understood by one of ordinary skill in the art. In the embodiment illustrated in FIG. 5, the output of the switch is coupled to the adjustable capacitive divider 530, and can be used to adjust the net, e.g., equivalent, capacitance of the adjustable capacitive divider 530. However, embodiments of the present disclosure are not so limited, and can include other devices and/or methods for logically adjusting the capacitances of the adjustable capacitors and/or the net, e.g., equivalent, capacitance of the adjustable capacitive divider.

As shown in the embodiment illustrated in FIG. 5, a reference level, e.g., $V_{ref}$, can be generated by applying a single input voltage, e.g., $V_{input}$, to the capacitive divider 530. The reference level and single input voltage can be analogous to the reference level and single input voltage previously described in connection with FIG. 4.

Figure 6:
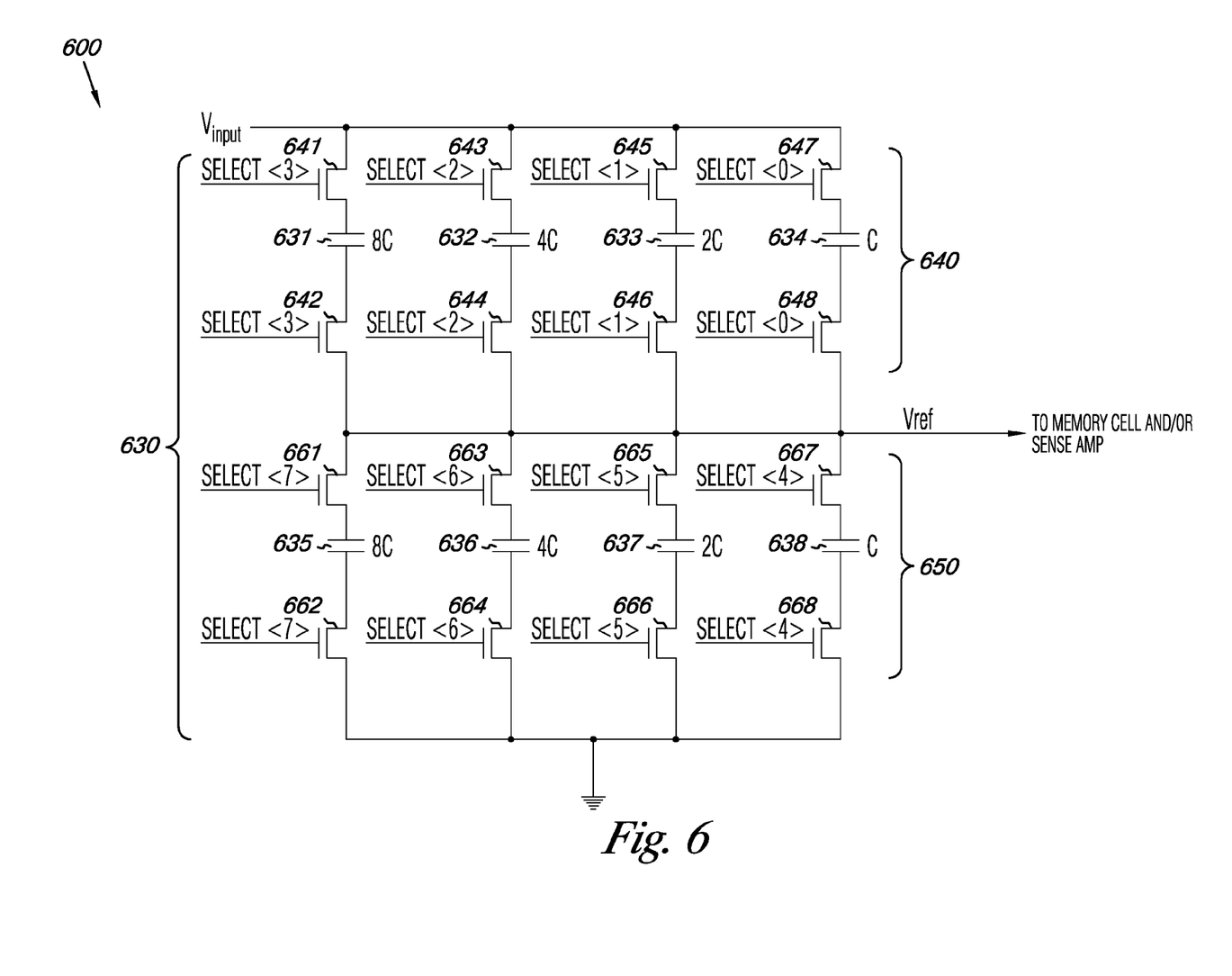
FIG. 6 is a schematic illustrating a portion of sensing circuitry in accordance with one or more embodiments of the present disclosure.

FIG. 6 is a schematic illustrating a portion of sensing circuitry 600 in accordance with one or more embodiments of the present disclosure. Sensing circuitry 600 can be used in resistance variable memory cell sensing operations, e.g., operations that determine the data state of a resistance variable memory cell.

In the embodiment illustrated in FIG. 6, sensing circuitry 600 includes a capacitive divider 630. In the embodiment illustrated in FIG. 6, the capacitive divider 630 includes a number of capacitors, e.g., 631, 632, 633, 634, 635, 636, 637, and 638, coupled in parallel. In the embodiment illustrated in FIG. 6, capacitors 631, 632, 633, 634, 635, 636, 637, and 638 are arranged in a binary-weighted configuration, e.g., capacitors 631 and 635 have capacitances of 8 C, capacitors 632 and 636 have capacitances of 4 C, capacitors 633 and 637 have capacitances of 2 C, and capacitors 634 and 638 have capacitances of C, where C is some capacitance value. In the embodiment illustrated in FIG. 6, each capacitor is an adjustable capacitor, and capacitive divider 630 is an adjustable capacitive divider. Embodiments of the present disclosure are not limited to the example illustrated in FIG. 6, and can include other capacitive dividers.

In one or more embodiments, the capacitances of the adjustable capacitors, e.g., 631, 632, 633, 634, 635, 636, and 637, can be adjusted, e.g., controlled, and/or trimmed, by logic. Additionally, in one or more embodiments, the net, e.g., equivalent, capacitance of the adjustable capacitive divider, e.g., 630, can be adjusted, e.g., controlled and/or trimmed, by logic. For example, in the embodiment illustrated in FIG. 6, SELECT signals, e.g., SELECT<0>, SELECT<1>, SELECT<2>, SELECT<3>, SELECT<4>, SELECT<5>, SELECT<6>, and SELECT<7>, are used to select and/or bypass the adjustable capacitors, thereby adjusting, e.g., controlling and/or trimming, the net, e.g., equivalent, capacitance of the adjustable capacitive divider 630. In one or more embodiments, the signal bits of the SELECT signals can be set by fuses and/or varied during memory cell operations. In the embodiment shown in FIG. 6, the SELECT signals are coupled to transistors, e.g., MOSFETs 641, 642, 643, 644, 645, 646, 647, 648, 661, 662, 663, 664, 665, 666, 667, and 668, and are used to adjust the net, e.g., equivalent, capacitance of the adjustable capacitive divider 630, as previously described in connection with FIG. 4.

As shown in FIG. 6, a reference level, e.g., $V_{ref}$, can be generated by applying a single input voltage, e.g., $V_{input}$, to the capacitive divider 630. The reference level and single input voltage can be analogous to the reference level and single input voltage previously described in connection with FIG. 4.

In one or more embodiments, the capacitive divider 630 can have a pull-up capacitance and a pull-down capacitance. As used herein, the term "pull-up capacitance" means a capacitance associated with a first part, e.g., area, of a capacitive divider, and the term "pull-down capacitance" means a capacitance associated with a second part, e.g., area, of the capacitive divider. For example, in the embodiment illustrated in FIG. 6, the pull-up capacitance is the capacitance associated with the parallel arrangement 640 of capacitors 631, 632, 633, and 634, and the pull-down capacitance is the capacitance associated with the parallel arrangement 650 of capacitors 635, 636, 637, and 638. However, embodiments of the present disclosure are not so limited, and can include other types of pull-up and pull-down capacitances. For example, a pull-down capacitance can be provided by sensing circuitry, e.g., a number of sense amps, as further described in connection with FIG. 9.

In one or more embodiments in which the capacitive divider has a pull-up capacitance and a pull-down capacitance, the reference level, e.g., $V_{ref}$, generated by the capacitive divider can be given by:

$$V_{ref} = (V_{input})(C_{pull-up}/(C_{pull-up}+C_{pull-down}))$$

where $V_{input}$ is the single input voltage, $C_{pull-up}$ is the pull-up capacitance of the capacitive divider, and $C_{pull-down}$ is the pull-down capacitance of the capacitive divider. Hence, for example, adjusting the adjustable capacitors and/or the adjustable capacitive divider such that the pull-up and pull-down capacitances are equal can result in the generation of a reference level of half the single input voltage.

Figure 7:
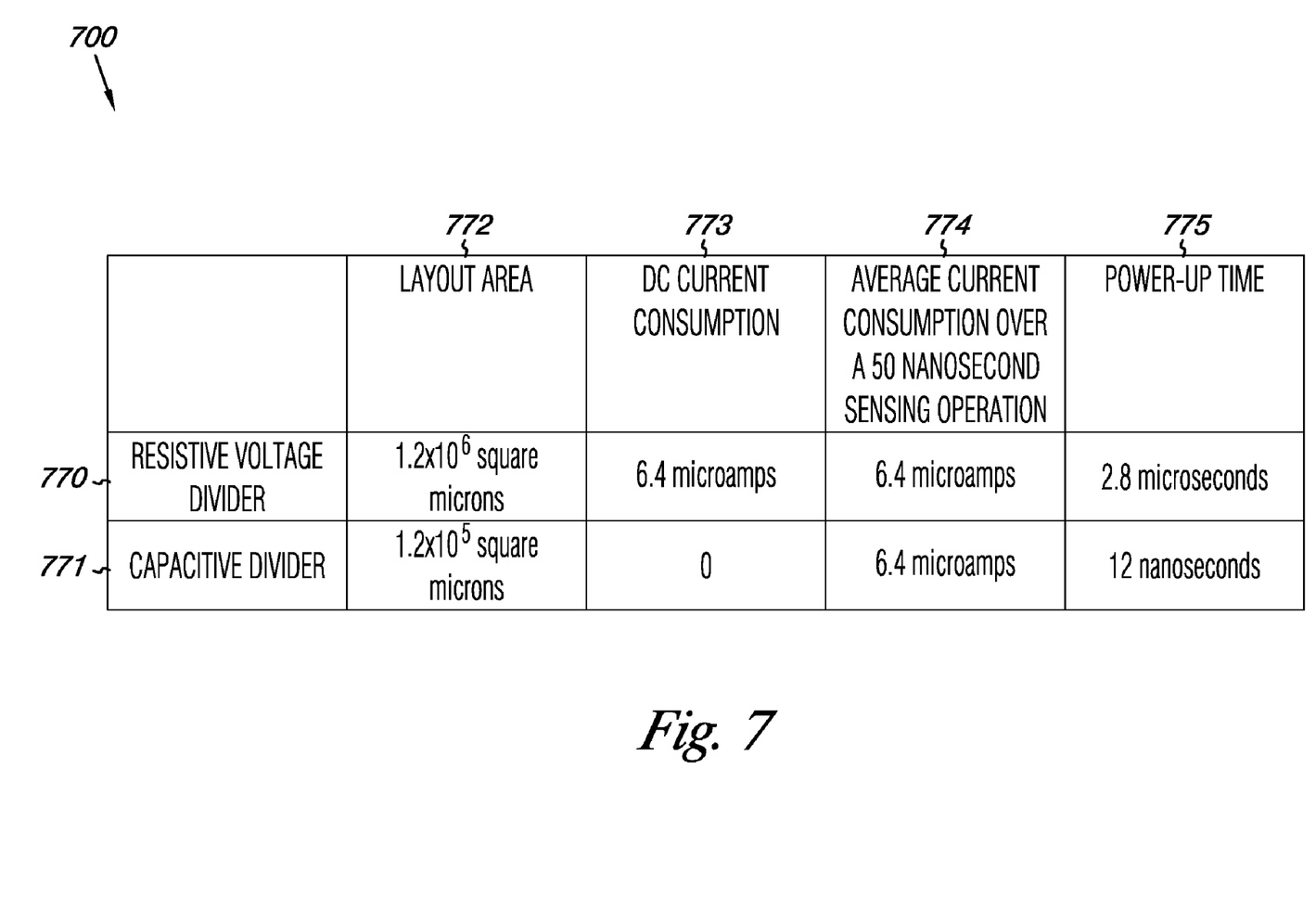
FIG. 7 illustrates a table comparing various characteristics of a resistive voltage divider with those of a capacitive divider that is in accordance with one or more embodiments of the present disclosure.

FIG. 7 illustrates a table 700 comparing various characteristics of a resistive voltage divider with those of a capacitive divider, e.g., capacitive dividers 330, 430, 530, and 630, that is in accordance with one or more embodiments of the present disclosure. Row 770 contains data for a resistive voltage divider, and row 771 contains data for a capacitive divider, e.g., capacitive dividers 330, 430, 530, and 630, in accordance with one or more embodiments of the present disclosure. Column 772 contains the layout area, column 773 contains the DC current consumption, column 774 contains the average current consumption over a 50 nanosecond sensing operation, and column 775 contains the power-up time, e.g., the time used to generate 90% of a reference level, e.g., $V_{ref}$, for a resistive divider and a capacitive divider that is in accordance with one or more embodiments of the present disclosure.

As shown in table 700, a resistance voltage divider has a layout area of $1.2 \times 10^6$ square microns, a DC current consumption of 6.4 microamps, an average current consumption of 6.4 microamps over a 50 nanosecond sensing operation, and a power-up time 2.8 microseconds. In contrast, a capacitive divider in accordance with one or more embodiments of the present disclosure can have a layout area of $1.2 \times 10^5$ square microns, zero DC current consumption, an average current consumption of 6.4 microamps over a 50 nanosecond sensing operation, and a power-up time of 12 nanoseconds. That is, to achieve a comparable current draw of 6.4 microamps, a resistive divider uses approximately 10 times the layout area used by a capacitive divider that is in accordance with one or more embodiments of the present disclosure. Further, as illustrated by column 773, a resistive voltage divider consumes a DC current, while a capacitive divider that is in accordance with one or more embodiments of the present disclosure does not consume a DC current. Additionally, the power-up time of a resistive voltage divider is approximately 1000 times longer than the power-up time of a capacitive divider that is in accordance with one or more embodiments of the present disclosure, as illustrated by column 775.

A capacitive divider that is in accordance with one or more embodiments of the present invention may experience parasitic leakage of charge from one or more capacitors in the capacitive divider, which can cause an error in the reference level, e.g., $V_{ref}$. A significant amount of error in the reference level due to leakage current can take approximately several milliseconds to occur. Charging the capacitive divider, e.g., applying the single input voltage $V_{input}$, at particular time intervals, rather than at the beginning of each sensing operation, can reduce the parasitic leakage of the capacitive divider, and hence reduce the power consumption of the capacitive divider. For example, pre-charging the capacitive divider every 1 millisecond instead of at the beginning of each sensing operation can result in an average current consumption of less than 1 nanoamp. Such particular time intervals can be set by an oscillator.

Figure 8:
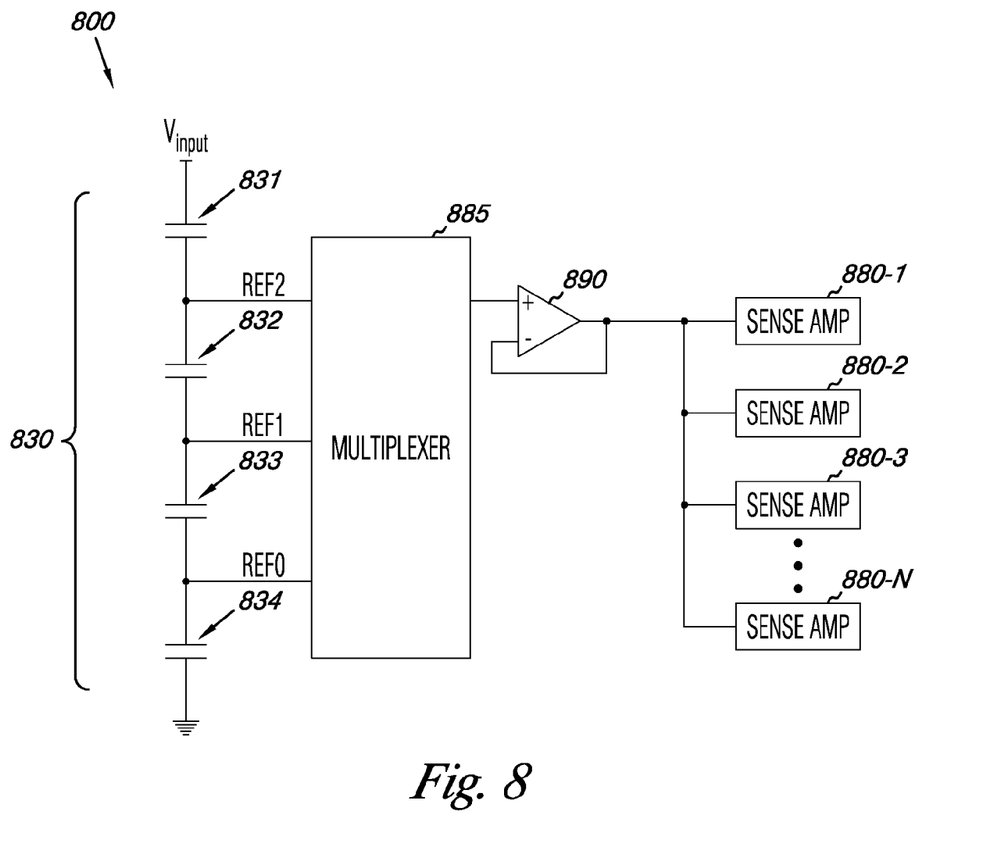
FIG. 8 is a schematic illustrating a portion of sensing circuitry in accordance with one or more embodiments of the present disclosure.

FIG. 8 is a schematic illustrating a portion of sensing circuitry 800 in accordance with one or more embodiments of the present disclosure. Sensing circuitry 800 can be used in resistance variable memory cell sensing operations, e.g., operations that determine the data state of a resistance variable memory cell.

In the embodiment illustrated in FIG. 8, sensing circuitry 800 includes capacitive divider 830, which can be analogous to capacitive divider 330 previously described in connection with FIG. 3. However, embodiments of the present disclosure are not so limited, and can include other capacitive dividers, for example, capacitive dividers analogous to those previously described in connection with FIGS. 4, 5, and 6.

As shown in the embodiment illustrated in FIG. 8, applying a single input voltage, e.g., $V_{input}$, to the capacitive divider 830 can generate a number of reference levels, e.g., REF2, REF1, and REF0, as previously described in connection with FIG. 3. In the embodiment illustrated in FIG. 8, the number of reference levels are coupled to one or more sensing circuits, e.g., sense amps 880-1, 880-2, 880-3, . . . , 880-N. Although the embodiment illustrated in FIG. 8 shows one reference level, e.g., REF2, coupled to the sense amps, embodiments of the present disclosure are not so limited, and can include any number of the number of reference levels being coupled to the sense amps. In one or more embodiments, the one or more sensing circuits can be located in a memory chip (not shown), and can be selectively coupled to one or more resistance variable memory cells, e.g., the phase change memory cells shown in FIG. 1. The one or more sensing circuits can be used in sensing operations in accordance with one or more embodiments of the present disclosure.

In one or more embodiments, the sensing circuits, e.g., the circuitry of the one or more sense amps, e.g., 880-1, 880-2, 880-3, . . . , 880-N, can have a capacitive load associated therewith. Hence, in one or more embodiments, coupling the one or more sense amps as shown in the embodiment illustrated in FIG. 8 can result in an additional capacitive load to the number of reference levels, e.g., a capacitive load not associated with the capacitive divider. This additional capacitive load can be on the order of several picofarads, and can cause a change in the values of the reference levels. However, in one or more embodiments, the effect of this additional capacitive load on the reference levels can be minimized, e.g., an appreciable change in the reference levels can be prevented, by coupling the reference levels to a buffer, e.g., unity gain buffer 890 shown in FIG. 8, and coupling the output of the buffer to the sense amps, as shown in the embodiment illustrated in FIG. 8. Alternatively, multiplexer 885 can selectively couple the reference levels REF0, REF1, or REF2 to unity gain buffer 890. Alternatively, in one or more embodiments, the buffer can be foregone, and the additional capacitive load associated with the circuitry of the sense amps can be included in the calculations for determining the reference levels to be used in a sensing operation, as further described below in connection with FIG. 9.

Figure 9:
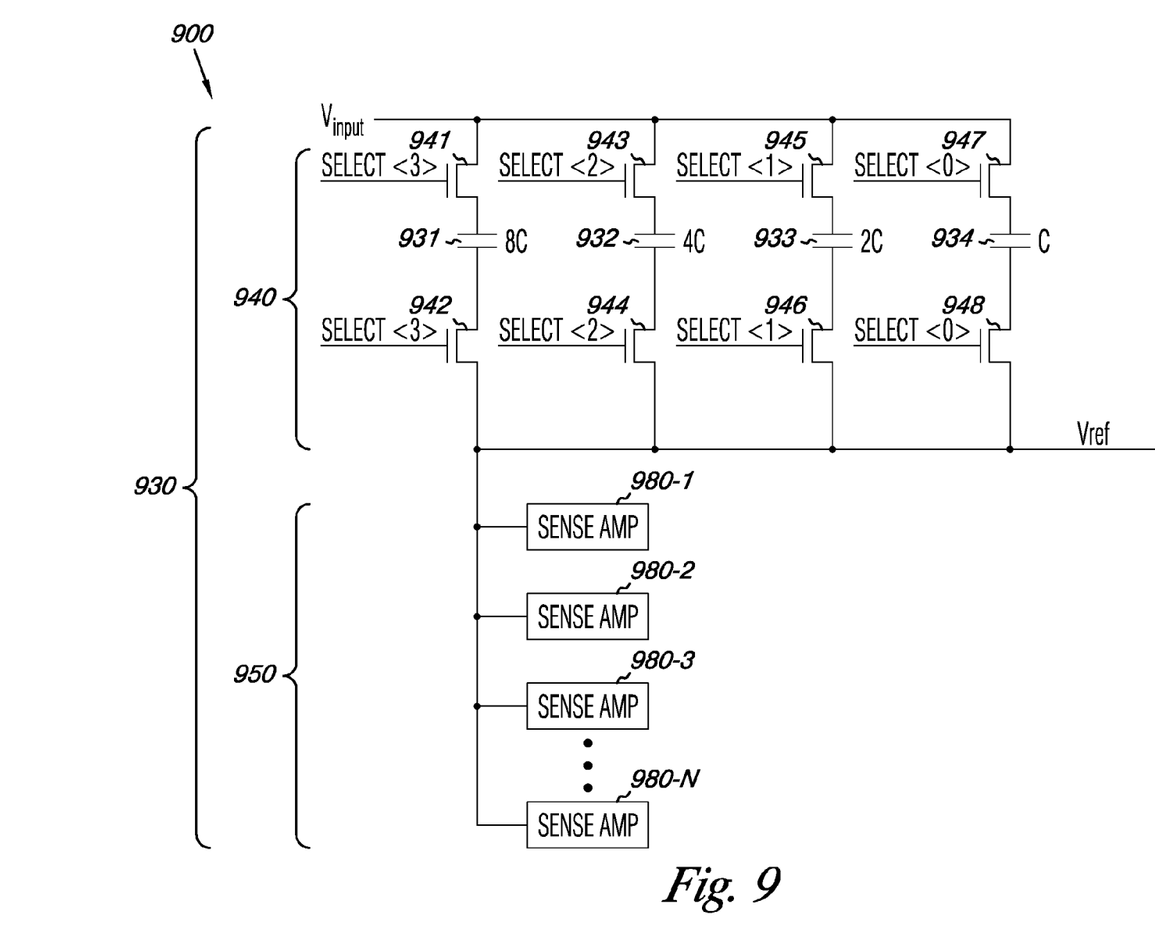
FIG. 9 is a schematic illustrating a portion of sensing circuitry in accordance with one or more embodiments of the present disclosure.

FIG. 9 is a schematic illustrating a portion of sensing circuitry 900 in accordance with one or more embodiments of the present disclosure. Sensing circuitry 900 can be used in resistance variable memory cell sensing operations, e.g., operations that determine the data state of a resistance variable memory cell.

In the embodiment illustrated in FIG. 9, sensing circuitry 900 includes capacitive divider 930. Capacitive divider 930 can be analogous to capacitive divider 630 previously described in connection with FIG. 6, except that capacitors 635, 636, 637, and 638, and their associated transistors, are not included, and the pull-down capacitance associated with capacitors 635, 636, 637, and 638 is instead provided by a capacitive load associated with a number of sensing circuits, e.g., sense amps 980-1, 980-2, 980-3, . . . , 980-N, coupled to the reference level, e.g., $V_{ref}$. That is, capacitive divider 930 can have a pull-up capacitance associated with parallel capacitor arrangement 940, which is analogous to parallel arrangement 640, and a pull-down capacitance associated with sense amp arrangement 950.

As shown in the embodiment illustrated in FIG. 9, applying a single input voltage, e.g., $V_{input}$, to the capacitive divider 930 can generate a reference level e.g., $V_{ref}$, as previously described in connection with FIG. 6. In the embodiment illustrated in FIG. 9, the reference level is coupled to one or more sensing circuits, e.g., sense amps 980-1, 980-2, 980-3, . . . , 980-N. In one or more embodiments, the one or more sensing circuits can be located in a memory chip (not shown), and can be selectively coupled to one or more resistance variable memory cells, e.g., the phase change memory cells shown in FIG. 1. The one or more sensing circuits can be used in sensing operations in accordance with one or more embodiments of the present disclosure.

As previously described in connection with FIG. 8, in one or more embodiments the sensing circuitry, e.g., sense amps 980-1, 980-2, 980-3, . . . , 980-N, can have a capacitive load associated therewith that can be included in the calculations for determining the reference level, e.g., $V_{ref}$, to be used in a sensing operation. That is, in one or more embodiments, e.g., the embodiment illustrated in FIG. 9, the reference level generated by the capacitive divider can be dependent upon the capacitive load associated with the sense amps to which the reference level is coupled. In the embodiment shown in FIG. 9, the capacitive load associated with the sense amps provides the pull-down capacitance of the capacitive divider 930. However, embodiments of the present disclosure are not so limited, and the capacitive load associated with the sense amps can be a part of fixed and/or adjustable capacitive dividers having other series and/or parallel configurations, e.g., capacitive dividers analogous to those previously described in connection with FIGS. 3, 4, and 5.

In one or more embodiments, the capacitive load associated with sensing circuitry, e.g., sense amps 980-1, 980-2, 980-3, . . . , 980-N, can depend on the operational state of the sensing circuitry. That is, in one or more embodiments, the capacitive load associated with a sense can depend on whether the sensing circuitry is being used in a sensing operation. Further, in one or more embodiments, the capacitive load associated with sensing circuitry that is being used in a sensing operation, e.g., a selected sense amp, can vary throughout the sensing operation. In contrast, in one or more embodiments, the capacitive load associated with sensing circuitry that is not being used in a sensing operation, e.g., a de-selected sense amp, can remain constant while the sensing circuitry is not being used. Hence, in one or more embodiments, the capacitive load associated with the sensing circuitry can be the capacitive load associated with one or more of the sensing circuits, e.g., sense amps 980-1, 980-2, 980-3, . . . , 980-N, that are de-selected, e.g., not being used in a sensing operation.

Figure 10:
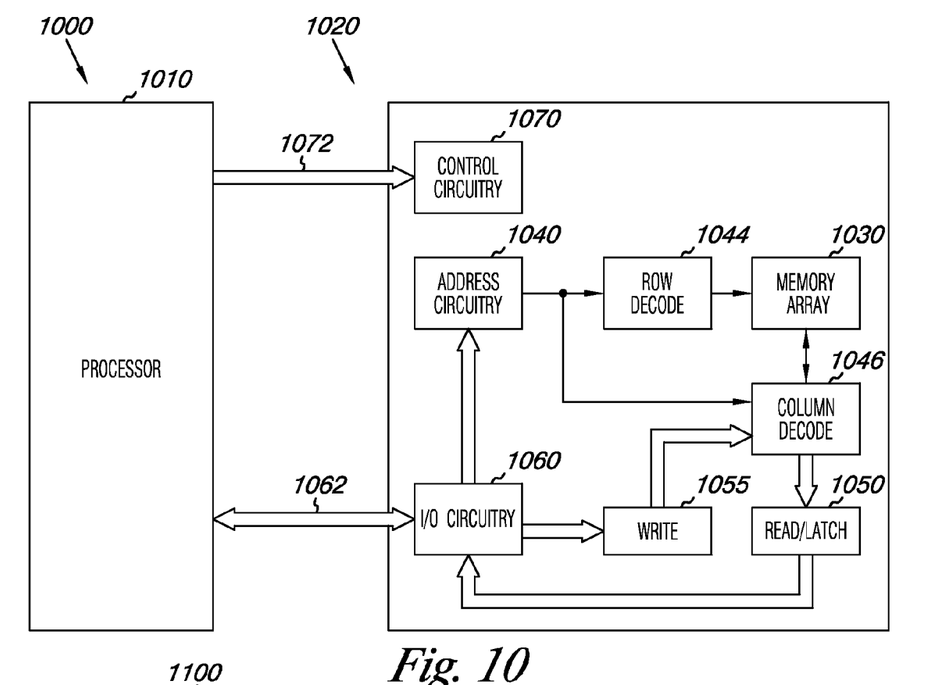
FIG. 10 is a functional block diagram of an electronic memory system having at least one memory device in accordance with one or more embodiments of the present disclosure.

FIG. 10 is a functional block diagram of an electronic memory system 1000 having at least one memory device 1020 in accordance with one or more embodiments of the present disclosure. Memory system 1000 can include a processor 1010 coupled to a memory device 1020 that can include a memory array 1030 of memory cells. The memory system 1000 can include separate integrated circuits or both the processor 1010 and the memory device 1020 can be on the same integrated circuit. The processor 1010 can be a microprocessor or some other type of controlling circuitry such as an application-specific integrated circuit (ASIC).

The memory device 1020 can include an array of memory cells 1030, which can be resistance variable memory cells with a PCRAM architecture, for example. The embodiment of FIG. 10 includes address circuitry 1040 to latch address signals provided over I/O connections 1062 through I/O circuitry 1060. Address signals can be received and decoded by a row decoder 1044 and a column decoder 1046 to access the memory array 1030. It will be appreciated by those skilled in the art that the number of address input connections can depend on the density and architecture of the memory array 1030 and that the number of addresses can increase with both increased numbers of memory cells and increased numbers of memory blocks and arrays.

The memory array 1030 can include multilevel memory cells having different numbers of programmed states, sensing references, etc., according to embodiments described herein. The read/latch circuitry 1050 can read and latch a page or row of data from the memory array 1030. I/O circuitry 1060 can be included for bi-directional data communication over the I/O connections 1062 with the processor 1010. Write circuitry 1055 can be included to write data to the memory array 1030.

Control circuitry 1070 can decode signals provided by control connections 1072 from the processor 1010. These signals can include chip signals, write enable signals, and address latch signals that are used to control the operations on the memory array 1030, including data sensing, data write, and data erase operations. In one or more embodiments, the control circuitry 1070 can be responsible for executing instructions from the processor 1010 to perform the operations according to embodiments of the present disclosure. The control circuitry 1070 can be a state machine, a sequencer, or some other type of controller. It will be appreciated by those skilled in the art that additional circuitry and control signals can be provided, and that the memory device detail of FIG. 10 has been reduced to facilitate ease of illustration.

Figure 11:
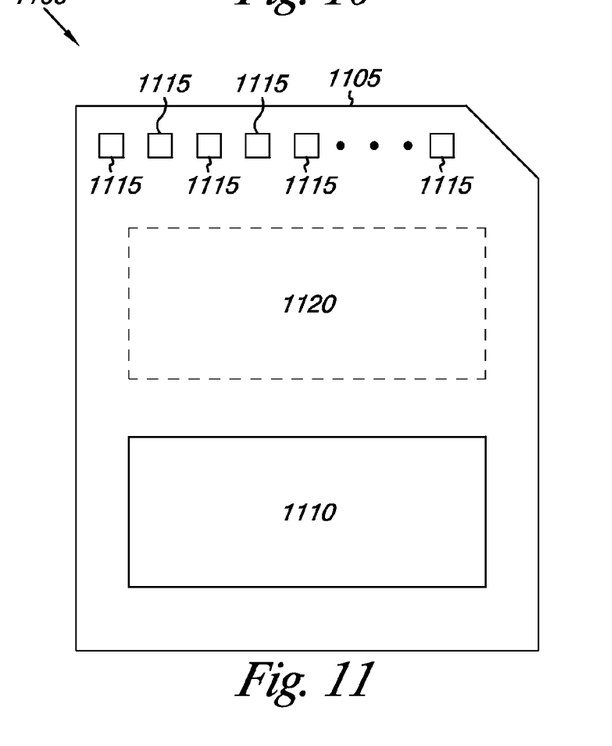
FIG. 11 is a functional block diagram of a memory module having at least one memory device in accordance with one or more embodiments of the present disclosure.

FIG. 11 is a functional block diagram of a memory module 1100 having at least one memory device 1110 in accordance with one or more embodiments of the present disclosure. Memory module 1100 is illustrated as a memory card, although the concepts discussed with reference to memory module 1100 are applicable to other types of removable or portable memory (e.g., USB interface drives) and are intended to be within the scope of "memory module" as used herein. In addition, although one example form factor is depicted in FIG. 1, these concepts are applicable to other form factors as well.

In one or more embodiments, memory module 1100 can include a housing 1105 (as depicted) to enclose one or more memory devices 1110, though such a housing is not essential to all devices or device applications. At least one memory device 1110 can include an array of multilevel memory cells that can be sensed according to embodiments described herein. Where present, the housing 1105 includes one or more contacts 115 for communication with a host device. Examples of host devices include digital cameras, digital recording and playback devices, PDAs, personal computers, memory card readers, interface hubs and the like. For one or more embodiments, the contacts 1115 are in the form of a standardized interface. For example, with a USB interface drive, the contacts 1115 might be in the form of a USB Type-A male connector. In general, contacts 1115 can provide an interface for passing control, address and/or data signals between the memory module 1100 and a host having compatible receptors for the contacts 1115.

The memory module 1100 may optionally include additional circuitry 1120, which may be one or more integrated circuits and/or discrete components. For one or more embodiments, the additional circuitry 1120 may include control circuitry, such as a memory controller, for controlling access across multiple memory devices 1110 and/or for providing a translation layer between an external host and a memory device 1110. For example, there may not be a one-to-one correspondence between the number of contacts 1115 and a number of 1110 connections to the one or more memory devices 1110. Thus, a memory controller could selectively couple an I/O connection (not shown in FIG. 11) of a memory device 1110 to receive the appropriate signal at the appropriate I/O connection at the appropriate time or to provide the appropriate signal at the appropriate contact 1115 at the appropriate time. Similarly, the communication protocol between a host and the memory module 1100 may be different than what is required for access of a memory device 1110. A memory controller could then translate the command sequences received from a host into the appropriate command sequences to achieve the desired access to the memory device 1110. Such translation may further include changes in signal voltage levels in addition to command sequences.

The additional circuitry 1120 may further include functionality unrelated to control of a memory device 1110 such as logic functions as might be performed by an ASIC. Also, the additional circuitry 1120 may include circuitry to restrict read or write access to the memory module 1100, such as password protection, biometrics or the like. The additional circuitry 1120 may include circuitry to indicate a status of the memory module 1100. For example, the additional circuitry 1120 may include functionality to determine whether power is being supplied to the memory module 1100 and whether the memory module 1100 is currently being accessed, and to display an indication of its status, such as a solid light while powered and a flashing light while being accessed. The additional circuitry 1120 may further include passive devices, such as decoupling capacitors to help regulate power requirements within the memory module 1100.

CONCLUSION

Methods, devices, and systems for sensing resistance variable memory cells are described herein. One or more embodiments include a capacitive divider as part of a sensing scheme having low average power consumption and/or fast power-up time.

One or more embodiments can include at least one resistance variable memory cell, and a capacitive divider configured to generate multiple reference levels in association with the at least one resistance variable memory cell. One or more method embodiments can include generating multiple reference levels by applying a voltage level to a capacitive divider, and comparing at least one of the multiple reference levels with an output of the resistance variable memory cell.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory device comprising:
   at least one resistance variable memory cell;
   at least one sensing circuit; and
   a capacitive divider configured to generate multiple reference levels in association with the at least one resistance variable memory cell, wherein at least one reference level is coupled to the at least one sensing circuit.

2. The memory device of claim 1, wherein:
   the at least one resistance variable memory cell is a phase change random access memory (PCRAM) cell;
   the capacitive divider is an adjustable capacitive divider; and
   a capacitance of the adjustable capacitive divider is adjusted by logic.

3. The memory device of claim 2, wherein the adjustable capacitive divider is arranged in series in a binary-weighted configuration.

4. The memory device of claim 2, wherein the adjustable capacitive divider is arranged in a C-2 C configuration.

5. The memory device of claim 2, wherein:
   the adjustable capacitive divider includes a number of capacitors; and
   at least one of the number of capacitors are selected by at least one logic signal.

6. The memory device of claim 5, wherein:
   the at least one logic signal is set by one or more fuses; and
   the at least one logic signal is varied during operation of the memory device.

7. The memory device of claim 1, wherein the multiple reference levels are temperature independent.

8. The memory device of claim 1, wherein the multiple reference levels are voltage levels.

9. The memory device of claim 1, wherein the capacitive divider occupies an area of about $1.2 \times 10^5$ square microns or less.

10. The memory device of claim 1, wherein the capacitive divider is configured to consume an average current of about 6.4 microamps over a 50 nanosecond sensing operation.

11. The memory device of claim 1, wherein the memory device includes a bandgap circuit configured to charge the capacitive divider.

12. A memory device comprising:
at least one resistance variable memory cell;
at least one sensing circuit; and
an adjustable capacitive divider configured to generate at least one reference level, wherein the at least one reference level is coupled to the at least one sensing circuit.

13. The memory device of claim 12, wherein the adjustable capacitive divider is configured to generate at least 90% of the at least one reference level in 12 nanoseconds or less.

14. The memory device of claim 12, wherein:
the adjustable capacitive divider is arranged in parallel; and
a capacitance of the adjustable capacitive divider is adjusted by logic.

15. The memory device of claim 14, wherein the adjustable capacitive divider is arranged in a binary weighted configuration.

16. The memory device of claim 14, wherein the adjustable capacitive divider has a pull-up capacitance and a pull-down capacitance.

17. The memory device of claim 16, wherein:
the memory device includes at least one sensing circuit; and
the pull down capacitance is a capacitive load associated with the at least one sensing circuit.

18. A memory device comprising:
at least one phase change random access memory (PCRAM) cell;
at least one sensing circuit; and
an adjustable capacitive divider, wherein:
the adjustable capacitive divider is configured to generate at least one reference level;
the at least one reference level is coupled to the at least one sensing circuit; and
a capacitance of the adjustable capacitive divider is adjusted by logic.

19. The memory device of claim 18, wherein the adjustable capacitive divider has a capacitive load associated with the at least one sensing circuit.

20. The memory device of claim 18, wherein:
the at least one reference level is coupled to a buffer; and
the buffer is coupled to the at least one sensing circuit.

21. A method for sensing a resistance variable memory cell, comprising:
generating multiple reference levels, wherein generating multiple reference levels includes charging a capacitive divider; and
comparing at least one of the multiple reference levels with an output of the resistance variable memory cell.

22. The method of claim 21, including generating the multiple reference levels sequentially.

23. The method of claim 21, including generating the multiple reference levels simultaneously.

24. The method of claim 21, including charging the capacitive divider at a particular time interval.

25. The method of claim 24, including charging the capacitive divider at a particular time interval of about 1 millisecond.

26. The method of claim 21, including pulling the reference levels to ground after the comparing the at least one reference level with the output of the resistance variable memory cell when the reference levels are not being used.

27. A method for sensing phase change random access memory (PCRAM) cells, comprising:
generating a first reference level, wherein generating the first reference level includes charging an adjustable capacitive divider;
comparing the first reference level with an output of a PCRAM cell;
logically adjusting a capacitance of the adjustable capacitive divider in response to the comparison of the first reference level with the output of the PCRAM cell; and
generating a second reference level.

28. The method of claim 27, including comparing the second reference level with the output of the PCRAM cell.

29. The method of claim 27, including using a state machine to determine the capacitance to which the adjustable capacitive divider is adjusted.

* * * * *